(12) United States Patent
Kim et al.

(10) Patent No.: US 7,326,292 B2
(45) Date of Patent: Feb. 5, 2008

(54) QUALITY EVALUATION METHOD FOR SINGLE CRYSTAL INGOT

(75) Inventors: Jin Geun Kim, Gyeongsangbuk-do (KR); Hyon Jong Cho, Gyeongsangbuk-do (KR)

(73) Assignee: Siltron Inc. (KR)

( * ) Notice: Subject to any disclaimer, the term of this patent is extended or adjusted under 35 U.S.C. 154(b) by 28 days.

(21) Appl. No.: 11/424,060

(22) Filed: Jun. 14, 2006

(65) Prior Publication Data
US 2006/0282229 A1    Dec. 14, 2006

(30) Foreign Application Priority Data
Jun. 14, 2005    (KR) ..................... 10-2005-0051082

(51) Int. Cl.
*C30B 35/00* (2006.01)
(52) U.S. Cl. ........................... 117/14; 117/15; 117/201; 117/202
(58) Field of Classification Search .................. 117/14, 117/15, 201, 202
See application file for complete search history.

(56) References Cited

U.S. PATENT DOCUMENTS 6,203,611 B1 *  3/2001  Kimbel et al. ................. 117/15
6,294,017 B1 *  9/2001  Hurle et al. ................... 117/13
6,411,391 B1 *  6/2002  Takanashi et al. .......... 356/604

* cited by examiner

*Primary Examiner*—Felisa Hiteshew
(74) *Attorney, Agent, or Firm*—Grossman, Tucker, Perreault & Pfleger, PLLC

(57) ABSTRACT

The inventive quality evaluation method for a single crystal ingot generally includes a step of determining cropping and sampling positions and a step of evaluating a sample. The step of determining cropping and sampling positions includes: (a) inputting basic information on the decision of cropping, sampling and prime positions according to equipments and products, (b) predetermining the cropping, sampling and prime positions according to the basic information, (c) monitoring a growing process of a growing ingot and analyzing/storing X factors related with the growing process of the growing ingot, and (d) determining the cropping and sampling positions based on the X factors related with the growing process.

11 Claims, 2 Drawing Sheets

QUALITY EVALUATION METHOD FOR SINGLE CRYSTAL INGOT

BACKGROUND OF THE INVENTION

1. Field of the Invention

The present invention relates to a quality evaluation method of a grown single crystal ingot, and more particularly to such a method, in which components (X factor) influencing the quality of a single crystal ingot monitored in a growing process thereof are selected and then a sampling rule capable of more reasonably and scientifically determining cropping and sampling positions of the single crystal ingot is established based on the integral comparison/analysis of the X factor to thereby minimize the amount of excessive inspections and useless primes, and in which the cropping and sampling operations of the ingot is implemented by an automated system, and the ingot cropping and sampling positions are objectively calculated and databased, so that productivity and efficiency can be maximized.

2. Description of the Prior Art

Silicon Wafers, etc. used as a substrate material for the fabrication of electronic devices such as semiconductors are obtained by slicing a single crystal silicon ingot in thin. A single crystal ingot is produced by forming polycrystalline silicon into a cylindrical single crystal body through Czochralski method (hereinafter referred to as "CZ method") or Float Zone method (hereinafter referred to as "FZ method"), machining the outer surface of the single crystal body such that the body has a uniform diameter, and cutting the single crystal body to have a predetermined length. The CZ method for forming a single crystal will now be described in brief.

In the CZ method, first, a seed crystal is dipped into a polycrystalline silicon melt solution, and then pulled up to grow an thin elongated crystal from the seed crystal, which is called necking. Then, shouldering for growing the thin elongated single crystal in a diametrical direction perpendicular to the seed crystal pulling direction is performed such that the grown single crystal has a diameter equal to or greater than a predetermined diameter. The shouldered single crystal is grown successively, forming a body that will be formed into wafers. After the single crystal body is grown to a predetermined length, tailing is performed so that the single crystal body is reduced in diameter and then separated from the silicon melt. In this way, the entire process of growing the single crystal ingot is completed.

The grown single crystal body is so cropped as to leave only a body-grown part having a cylindrical shape, and the left cylindrical part is ground at its outer surface to have a predetermined diameter. Then, the cylindrical single crystal body having the predetermined diameter is cut into uniform lengths, by which single crystal ingots with a predetermined length are completely fabricated.

Finally, the single crystal ingot is sliced into wafers of a predetermined thickness by using an inner or outer edge blade or a wire. Then, a series of shaping and polishing processes are performed on such wafers to have properties adequate for the fabrication of semiconductor devices.

However, in the process of growing a single crystal silicon ingot, several process steps such as necking, shouldering, body growing and tailing are performed with the seed crystal contacting the polysilicon melt solution to grow the single crystal silicon ingot into a desired diameter and length. So, various process variables have to be considered when the process is carried out.

Therefore, before the cut body is sliced into thin wafers, the single crystal ingot grown up as above should be cut into a slug to evaluate its quality. That is, it is confirmed whether or not the ingot satisfies quality conditions such as resistivity according to user demand.

Conventionally, the cropping and sampling positions of the single crystal ingot have been determined empirically, for example, the quality evaluation of the single crystal ingot has been generally performed at regular intervals in such a manner that the ingot is cut at equal intervals of, for example, 10 cm to produce slugs or wafers, and the quality of the produced slugs or wafers is evaluated. Accordingly, there has been a problem in that evaluation cost per ingot is expensive too much.

SUMMARY OF THE INVENTION

Accordingly, the present invention has been made to solve the above-mentioned problems occurring in the prior art, and an object of the present invention is to provide a quality evaluation method of a grown single crystal ingot, which can provide a sampling rule capable of more reasonably and scientifically determining cropping and sampling positions of a single crystal ingot, by selecting components (X factor) influencing the quality of the single crystal ingot monitored in a growing process thereof and then establishing the sampling rule based on the integral comparison/analysis of the X factor.

Another object of the present invention is to provide a quality evaluation method of a grown single crystal ingot, which can minimize the amount of excessive inspections and useless primes, can implement the cropping and sampling operations of the ingot by an automated system, and can maximize productivity and efficiency by objectively calculating and databasing the ingot cropping and sampling positions.

In order to accomplish this object, there is provided a quality evaluation method for a single crystal ingot including steps of determining cropping and sampling positions and evaluating sample quality, wherein the step of determining cropping and sampling positions comprises: (a) inputting basic information on the decision of cropping, sampling and prime positions according to equipments and products; (b) predetermining the cropping, sampling and prime positions according to the basic information; (c) monitoring a growing process of an ingot and analyzing/storing an X factor related with the growth of the ingot; and (d) determining the cropping and sampling positions based on the basic information and the X factor.

Preferably, the step (d) includes: (d-1) setting control limit about the X factor; (d-2) confirming whether or not the X factor is beyond the control limit; and (d-3) if the X factor is beyond the control limit at a specific point, designating those points before and after the specific point as prime start and end positions.

Preferably, the X factor in the step (c) is at least one selected from the group consisting of the diameter of the growing ingot, the pull and rotation speeds of a seed crystal and the intensity of a magnetic field.

The quality evaluation method may further include: measuring the weight and diameter of a grown ingot in order to estimate resistance.

Preferably, the step of evaluating sample quality includes: (e) cropping a grown ingot to form a slug and a block according to the cropping positions determined in the step (d); (f) evaluating the slug; (g) storing a result of the slug evaluation and data of the cropping positions; and (h) evaluating the quality of a sample.

Preferably, the step (e) includes: (e-1) cropping the grown ingot at a tail position to form a tail-end slug; (e-2) collecting the tail-end slug to measure resistance; (e-3) cropping the grown ingot at a shoulder position and measuring the weight of a shoulder; and (e-4) cropping the grown ingot at a prime start position determined in the step (d) and collecting a prime start slug to measure resistance.

Preferably, the step (f) includes: (f-1) calculating a partition coefficient by using the weight of the grown ingot, the diameters of the grown ingot according to positions, the prime start and the resistivity of the tail end slug; (f-2) calculating initial resistivity (R0) by using shoulder weight and the partition coefficient; (f-3) calculating a solidification rate from the initial resistivity and the partition coefficient; (f-4) calculating a cumulative solidification rate by using the diameters of the ingot according to positions; and (f-5) estimating correct prime position by using the relationship between the solidification rate and the positions.

Preferably, the step (h) includes: (h-1) slicing the ingot to form a sample; and (h-2) evaluating the quality of the sample. Here, the quality evaluation method may further comprise: if a result of the quality evaluation in the step (h-2) is unsatisfactory, re-determining a sampling position, re-sampling, and reevaluating quality. Furthermore, the quality evaluation method may further comprise: inputting a result of quality evaluation in step (h-2) into the basic information.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

The quality evaluation method for a single crystal ingot generally includes a step of determining cropping and sampling positions and a step of evaluating a sample.

Here, the step of determining cropping and sampling positions includes: (a) inputting basic information on the decision of cropping, sampling and prime positions according to equipments and products, (b) predetermining the cropping, sampling and prime positions according to the basic information, (c) monitoring a growing process of an ingot and analyzing/storing X factors related with the growth of the grown ingot, and (d) determining the cropping and sampling positions based on the X factors related with the growing process.

Figure 1:
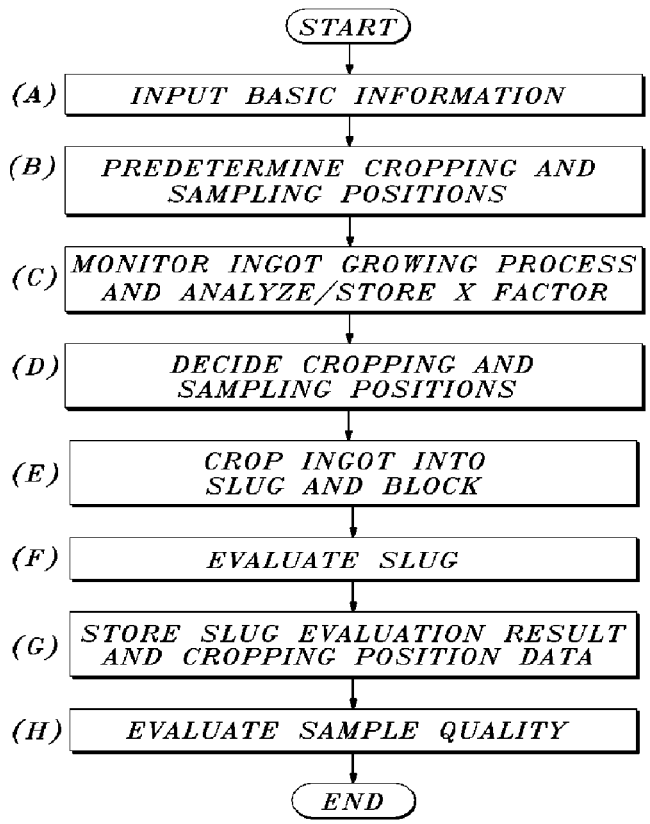
FIG. 1 is a flowchart generally illustrating a quality evaluation method for a single crystal ingot.

As shown in FIG. 1, first in the step (a), an operator inputs basic information about cropping positions of an ingot, a sampling method (sampling positions and sampling number) and a prime position selection method according to equipments and products based on existing data. The basic information means cropping and sampling positions, sampling number and so on according to previous experiences.

In addition, when evaluation items and the number of samples for quality evaluation on samples are minimized, they can be expressed with basic sampling rule as follows:

TABLE 1

| evaluation item | number of samples | | | | | |
|---|---|---|---|---|---|---|
| Res/Oi/OISF/Cs | 1 | 1 | 1 | 1 | 1 | 1 |
| FPD/LDP |   | 1 | 1 | 1 | 1 |   |

Here, Res is resistivity, Oi is oxygen concentration, OISF is short for oxidation induced stacking fault, Cs is carbon concentration, FPD is short for flow pattern defects which appear after secco etching on wafer surface, and LDP is short for loop dislocation pit which means interstitial defects.

Then, in step (b), cropping and sampling positions are predetermined according to the basic information inputted.

In step (c), an ingot growing process is monitored, and major factors related with the ingot growth (hereinafter referred to as "X factor") are analyzed and stored. Here, the X factors are main process variables necessary for the process to grow a high purity ingot with a desired diameter and less crystal defects, and include, for example, magnetic field intensity, ingot diameter, pull speed and rotation speed. In particular, the pull speed of a seed crystal, together with temperature conditions determined by a hot zone structure of a puller, determines the diameter, growth rate and quality of a growing single crystal ingot.

Like this, the X factors such as the monitored pull speed of the seed crystal are added to the basic information on the cropping and sampling positions in order to optimize the cropping and sampling positions of the ingot thereby minimizing the number of samples.

Describing it in more detail, since the diameter of the single crystal ingot is inverse proportional to the pull speed, slowing down the pull speed to increase the diameter of the ingot is economically inefficient. In addition, if the pull speed of the seed crystal is not sufficiently high, point defects built up during single crystal growth migrate through diffusion to causes a qualitative problems of the ingot in that large-scale dislocation loops are formed, which is also called "large dislocation".

In the meantime, if the pull speed is increased, the diameter of the ingot cannot be ensured sufficiently. Furthermore, those areas which are solidified during crystal growth are cooled down rapidly so that excessive point defects remain inside the crystal without migrating to the outer circumference of the ingot.

Elaborating on the crystal defects in more detail, if the pull speed of the seed crystal exceeds a pull speed range of a target, vacancy defects such as FPD take place. In the opposite case, interstitial defects such as Loop Dislocation Pits (LDP) take place.

Thus, the pull speed of the seed crystal for determining the productivity and quality of a single crystal is more preferably selected as an X factor.

Furthermore, it is more preferable to measure the weight of a grown ingot in order to estimate resistance that will be described later, and to measure the diameter of the ingot for the addition of a sample.

Then, the step (d) determines the cropping and sampling positions with reference to the basic information and the X factors related to ingot growth, in which prime start and end positions are determined and the a block is cut.

That is, the step (d) is carried out to determine the prime start and end positions based on the basic X factors analyzed in the step (c) above, and includes sub-steps of (d-1) setting control limit about the X factors, (d-2) confirming whether or not the X factors are beyond the control limit, and (d-3) if the X factors are beyond the control limit at a specific point, designating those points before and after the specific point as the prime start and end positions.

Figure 2:
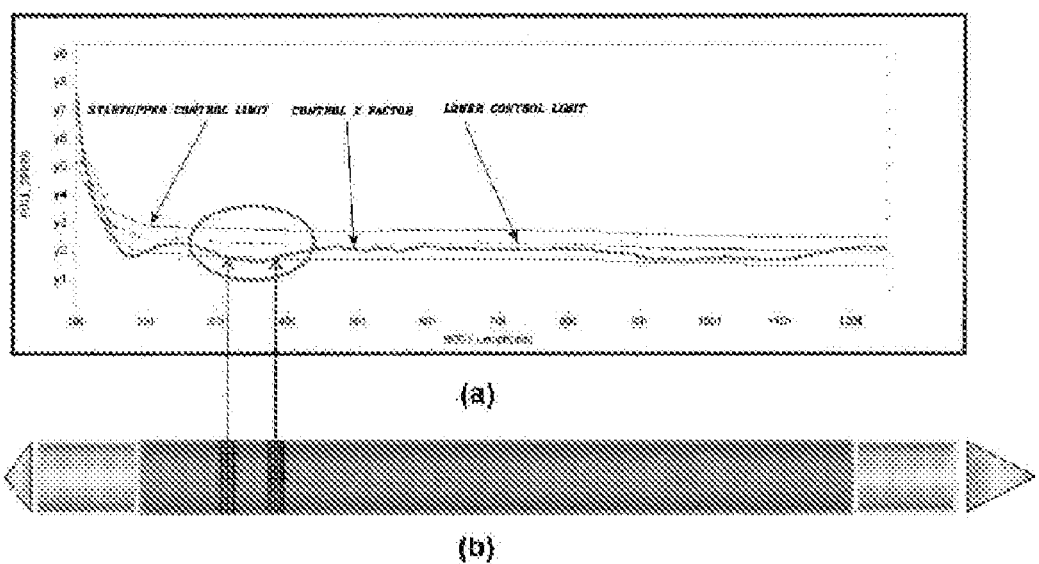
FIG. 2(a) is a graph illustrating a result of X factor monitoring according to an embodiment of the invention.
FIG. 2(b) is a view illustrating a sampling example according to the monitoring in FIG. 2(a)

As shown in FIG. 2(a), the operator primarily presets the control limit on the X factors such as the pull speed of the seed crystal, confirms whether or not the pull speed of the seed crystal monitored in the ingot growth process is beyond the control limit, and if the pull speed of the seed crystal is beyond the control limit at a specific point, designates those points before and after the specific point as the cropping and/or sampling positions.

This embodiment of the invention predetermines the cropping and sampling positions in the step (b) according to the basic information inputted in the step (a) and then determines the cropping and sampling positions referring to major factors that may affect ingot growth conditions such as the pull speed of the seed crystal, thereby solving a conventional problem of excessive sampling owing to empirical decision of cropping positions and equal sampling interval.

That is, this embodiment can solve a problem of excessive inspection and minimize the quantity of unused prime by performing cropping after the calculation of the prime start and end positions.

In addition, the cropping positions determined as above are inputted to the basic information and act as sampling addition positions, which is called sampling addition owing to X factor analysis.

Next, the step of evaluating sample quality includes: (e) cropping the ingot to form a slug and a block according to the cropping positions determined in the step (d), (f) evaluating the slug, and (g) storing a result of the slug evaluation and data of the cropping positions.

After the cropping positions are determined in step (d) with reference to the basic information inputted in the step (a) and the X factors such as the pull speed of the seed crystal monitored in the step (c) above, the ingot is cropped according to the determined positions, thereby forming a slug in step (e) (see FIG. 2b).

Describing the step (e) of forming a slug and a block in detail, the step (e) includes sub-steps of: (e-1) cropping the grown ingot at a tail position to form a tail-end slug, (e-2) collecting the tail-end slug to measure resistance, (e-3) cropping the grown ingot at a shoulder position and measuring the weight of a shoulder in order to perform resistance estimation to be described later, and (e-4) cropping the grown ingot at a prime start position determined in the step (d) and collecting a prime start slug to measure resistance.

Figure 3:
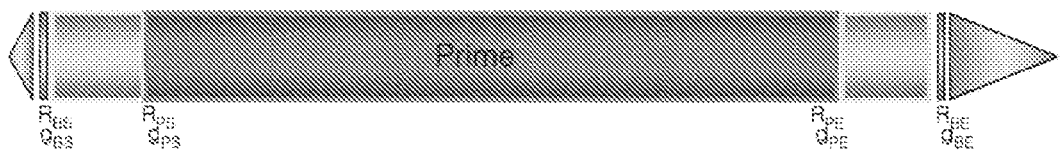
FIG. 3 is a cross-sectional view illustrating an ingot cropping position for estimating prime resistance position according to an embodiment of the invention.

Then, the step (f) of evaluating the slug formed as above is carried out to analyze slug data by using following equations, and includes sub-steps of: (f-1) calculating a partition coefficient k by using the weight of the grown ingot, the diameters of the grown ingot according to positions, the prime start and the resistivity of the tail end slug, (f-2) calculating initial resistivity $R_0$ by using shoulder weight and the partition coefficient, (f-3) calculating a solidification rate from the initial resistivity and the partition coefficient k, (f-4) calculating a cumulative solidification rate g by using the diameters of the ingot according to positions, and (f-5) estimating correct prime position by using the relationship between the solidification rate and the positions (see FIG. 3).

That is, the step (f) is performed to analyze slug data to estimate positions that optimally satisfy resistivity quality of a prime product, thereby maximizing the length of the prime. Here, prime resistivity is estimated according to the resistance of the tail end slug and the weight of the shoulder measured in the step (b) above according to basic equation below.

| basic equation | $R = R_0(1 - g)^{1-k}$<br>R: resistivity, $R_0$: initial resistivity,<br>g: solidification rate, k: partition coefficient |
|---|---|

First, partition coefficient k is calculated from the solidification rate and the slug resistivity at the position where the slug is obtained according to Equation 1 below:

$$k = 1 - \frac{\ln\frac{R_{BS}}{R_{BE}}}{\ln\frac{1 - g_{BS}}{1 - g_{BE}}} \quad (1)$$

Then, the weight of the shoulder is measured, and then $R_0$ is calculated according to Equation 2 below:

$$R_0 = \frac{R_{BS}}{(1 - g_{BS})^{1-K}} \quad (2)$$

Next, solidification rate g corresponding to resistivity characteristic for customer is calculated according to Equation 3 below:

$$g_{PS} = 1 - \left(\frac{R_{PS}}{R_0}\right)^{\frac{1}{1-K}} \quad (3)$$

Then, the position of the ingot corresponding to the resistivity characteristic for customer is calculated. That is, diameters of the ingot according to position are measured with an ingot diameter profiler, and the cumulative solidification rate g according to position is calculated by Equation 4 below:

$$P_X = P_n + \frac{g_X - g_n}{g_{n+1} - g_n} \times (P_{n-1} - P_n) \quad (4)$$

Finally, the exact position of the prime is determined using the relation of the solidification rates according to positions (position vs. solidification rate).

In addition, the result of the slug evaluation and data of the cropping positions is stored in step (g), in which the slug evaluation result obtained in the step (f) is inputted into the basic information so that the cropping position can be set as a predetermined cropping position or deleted.

That is, a sample is added in a prime resistance position estimated above, and thus a final sample position is determined.

Finally, the step (h) of evaluating the quality of a sample includes sub-steps of (h-1) slicing the ingot to form the sample, and (h-2) evaluating the quality of the sample. Next step of wafer fabrication is performed only if the quality evaluation has a satisfactory result.

That is, the ingot is sliced according to the added/determined position to produce the sample, and through this sampling, goes through quality evaluation according to the quality evaluation items such as oxygen concentration, resistivity and carbon concentration.

Furthermore, if the result of the quality evaluation in the step (h-2) is unsatisfactory, a sampling position is determined again to reevaluate ingot quality through sampling, and if its result if satisfactory, next step of wafer fabrication is performed.

Preferably, quality data (Y factor) is analyzed and inputted into the basic information in the step (a) to add a sample. This is referred to as sample addition by Y factor analysis.

As described above, analysis is made on abnormal growth position of X factor monitored above, estimated prime resistance position by the slug evaluation and Y factor, and such data is inputted/stored to be reflected on the ingot cropping and sampling steps.

Figure 4:
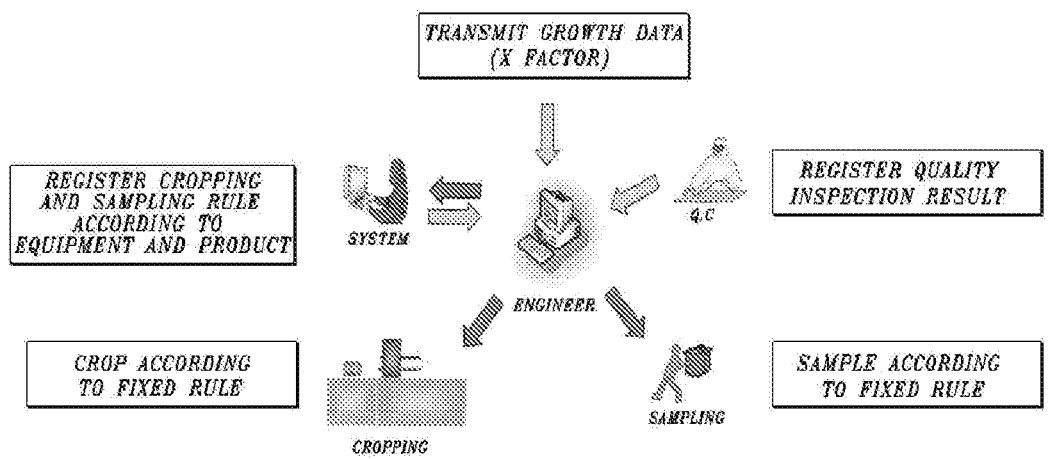
FIG. 4 is a view briefly illustrating a system according to an embodiment of the invention.

In the process for evaluating the quality of an ingot, cropping and sampling positions and sampling number are not determined uniformly. Rather, sampling rule is primarily made, by which ingot growth data, quality data and so on can be determined flexibly, and the cropping and sampling steps are carried out according to such sampling rule. This as a result can minimize excessive inspection or useless prime (see FIG. 4).

Although a preferred embodiment of the present invention has been described for illustrative purposes, those skilled in the art will appreciate that various modifications, additions and substitutions are possible, without departing from the scope and spirit of the invention as disclosed in the accompanying claims.

As described hereinbefore, the quality evaluation method for a single crystal ingot according to the invention has following effects.

First, components (X factor) influencing the quality of a single crystal ingot monitored in a growing process thereof are selected, and a sampling rule capable of determining cropping and sampling positions and sampling number of the ingot is established based on integral comparison/analysis of the X factor, which can prevent excessive samples.

In addition, the cropping is performed after the prime start and end positions are calculated in order to minimize excessive inspection and useless prime.

Accordingly, unlike conventional equal sampling interval method in which evaluation cost has been spent excessively owing to samples since cropping and sampling positions are equal in equal customer products, sampling evaluation cost can be minimized according to the invention.

Furthermore, the method of the invention analyzes abnormal growth position of X factor monitored above, estimated prime resistance position and Y factor as quality related data, respectively, and then inputs/stores individual data to reflect on the steps of determining cropping and sampling positions and the number of samples.

Accordingly, ingot cropping and sampling positions can be calculated objectively and then processed into database in order to maximize productivity and efficiency.

Moreover, the cropping and sampling steps are established through an automated system to automate the entire process, thereby reducing the load of operators or field load.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A quality evaluation method for a single crystal ingot including steps of determining cropping and sampling positions and evaluating sample quality, wherein the step of determining cropping and sampling positions comprises:
   (a) inputting basic information on the decision of cropping, sampling and prime positions according to equipments and products;
   (b) predetermining the cropping, sampling and prime positions according to the basic information;
   (c) monitoring a growing process of an ingot and analyzing/storing an X factor related with the growth of the ingot; and
   (d) determining the cropping and sampling positions based on the basic information and the X factor.

2. The quality evaluation method according to claim 1, wherein the step (d) comprises:
   (d-1) setting control limit about the X factor;
   (d-2) confirming whether or not the X factor is beyond the control limit; and
   (d-3) if the X factor is beyond the control limit at a specific point, designating those points before and after the specific point as prime start and end positions.

3. The quality evaluation method according to claim 1, wherein the X factor in the step (c) is at least one selected from the group consisting of the diameter of the growing ingot, the pull and rotation speeds of a seed crystal and the intensity of a magnetic field.

4. The quality evaluation method according to claim 1, further comprising: measuring the weight and diameter of a grown ingot in order to estimate resistance.

5. The quality evaluation method according to claim 1, wherein the step of evaluating sample quality comprises:
   (e) cropping a grown ingot to form a slug and a block according to the cropping positions determined in the step (d);
   (f) evaluating the slug;
   (g) storing a result of the slug evaluation and data of the cropping positions; and
   (h) evaluating the quality of a sample.

6. The quality evaluation method according to claim 5, wherein the step (e) comprises:
   (e-1) cropping the grown ingot at a tail position to form a tail-end slug;
   (e-2) collecting the tail-end slug to measure resistance;
   (e-3) cropping the grown ingot at a shoulder position and measuring the weight of a shoulder; and
   (e-4) cropping the grown ingot at a prime start position determined in the step (d) and collecting a prime start slug to measure resistance.

7. The quality evaluation method according to claim 5, wherein the step (f) comprises:

(f-1) calculating a partition coefficient by using the weight of the grown ingot, the diameters of the grown ingot according to positions, the prime start and the resistivity of the tail end slug;

(f-2) calculating initial resistivity by using shoulder weight and the partition coefficient;

(f-3) calculating a solidification rate from the initial resistivity and the partition coefficient;

(f-4) calculating a cumulative solidification rate by using the diameters of the ingot according to positions; and (f-5) estimating correct prime position by using the relationship between the solidification rate and the positions.

8. The quality evaluation method according to claim 5, wherein the step (h) comprises:

(h-1) slicing the ingot to form a sample; and (h-2) evaluating the quality of the sample.

9. The quality evaluation method according to claim 8, further comprising: if a result of the quality evaluation in the step (h-2) is unsatisfactory, re-determining a sampling position, re-sampling, and reevaluating quality.

10. The quality evaluation method according to claim 8, further comprising: inputting a result of quality evaluation in step (h-2) into the basic information.

11. The quality evaluation method according to claim 9, further comprising: inputting a result of quality evaluation in step (h-2) into the basic information.

* * * * *